United States Patent
Wu et al.

(10) Patent No.: US 10,356,858 B2
(45) Date of Patent: Jul. 16, 2019

(54) MICROLED DISPLAY PANEL

(71) Applicant: Prilit Optronics, Inc., Tainan (TW)

(72) Inventors: Biing-Seng Wu, Tainan (TW); Fa-Ming Chen, Tainan (TW)

(73) Assignee: Prilit Optronics, Inc., Tainan (TW)

(*) Notice: Subject to any disclaimer, the term of this patent is extended or adjusted under 35 U.S.C. 154(b) by 19 days.

(21) Appl. No.: 15/703,458

(22) Filed: Sep. 13, 2017

(65) Prior Publication Data

US 2018/0092173 A1    Mar. 29, 2018

(30) Foreign Application Priority Data

Sep. 26, 2016  (TW) .............................. 105131054 A
Jun. 7, 2017   (TW) .............................. 106118892 A (51) Int. Cl.
| G09F 9/33 | (2006.01) |
| H05B 33/08 | (2006.01) |
| G09F 1/00 | (2006.01) |
| H01L 25/075 | (2006.01) |
| H05K 1/03 | (2006.01) |
| H01L 25/16 | (2006.01) |

(52) U.S. Cl.
CPC ............ H05B 33/0815 (2013.01); G09F 1/00 (2013.01); G09F 9/33 (2013.01); H01L 25/0753 (2013.01); H01L 25/167 (2013.01); H05K 1/0306 (2013.01); H05K 2201/10053 (2013.01); H05K 2201/10106 (2013.01)

(58) Field of Classification Search
CPC ............ H05B 33/0815; H05B 33/0818; H05B 33/0884; H05B 33/0809

USPC .................... 315/224, 307, 119, 291, 191
See application file for complete search history.

(56) References Cited

U.S. PATENT DOCUMENTS

| 2012/0092389 | A1* | 4/2012 | Okuyama | G09F 9/33 345/690 |
| 2012/0320581 | A1* | 12/2012 | Rogers | H01L 24/24 362/235 |
| 2015/0309312 | A1* | 10/2015 | Alton | G02B 27/0172 345/592 |
| 2015/0331285 | A1* | 11/2015 | Bibl | G02F 1/133603 362/84 |
| 2015/0355521 | A1* | 12/2015 | Alton | G02F 1/167 250/214 AL |
| 2016/0231083 | A1* | 8/2016 | Regan | F41G 1/38 |
| 2016/0240118 | A1* | 8/2016 | Ray | G02B 27/225 |
| 2017/0061842 | A1* | 3/2017 | Cok | G09G 3/2003 |
| 2017/0061867 | A1* | 3/2017 | Cok | G09G 3/3208 |
| 2017/0187976 | A1* | 6/2017 | Cok | H04N 5/376 |
| 2017/0336831 | A1* | 11/2017 | Zhang | G06F 3/0416 |
| 2018/0025918 | A1* | 1/2018 | Yamazaki | H01L 29/66969 438/270 |
| 2018/0040665 | A1* | 2/2018 | Ohmae | H01L 29/41 |

(Continued)

*Primary Examiner* — Douldas W Owens
*Assistant Examiner* — Syed M Kaiser
(74) *Attorney, Agent, or Firm* — Donald E. Stout; Stout, Uxa & Buyan, LLP (57) ABSTRACT

A microLED display panel includes a substrate being divided into a plurality of sub-regions for supporting microLEDs, and a plurality of drivers being correspondingly disposed on surfaces of the sub-regions respectively. The driver includes a low-dropout (LDO) regulator and a drive circuit. The LDO regulator receives a system power, according to which a regulated power is generated and provided for the drive circuit.

17 Claims, 5 Drawing Sheets

(56) References Cited

U.S. PATENT DOCUMENTS

| | | | |
|---|---|---|---|
| 2018/0061307 A1* | 3/2018 | Inoue | G09G 3/2096 |
| 2018/0067249 A1* | 3/2018 | Bang | G02B 6/0055 |
| 2018/0090058 A1* | 3/2018 | Chen | G09G 3/32 |
| 2018/0092173 A1* | 3/2018 | Wu | G09F 1/00 |
| 2018/0131886 A1* | 5/2018 | Cok | H04N 5/376 |

* cited by examiner

MICROLED DISPLAY PANEL

CROSS-REFERENCE TO RELATED APPLICATIONS

This application claims priority of Taiwan Application No. 105131054, filed on Sep. 26, 2016, and Taiwan Application No. 106118892, filed on Jun. 7, 2017, the entire contents of which are hereby incorporated by reference.

BACKGROUND OF THE INVENTION

1. Field of the Invention

The present invention generally relates to a display panel, and more particularly to a microLED display panel.

2. Description of Related Art

A micro light-emitting diode (microLED, mLED or µLED) display panel is one of flat display panels, which is composed of microscopic microLEDs each of a size of 1-10 micrometers. Compared to conventional liquid crystal display panels, the microLED display panels offer better contrast, response times and energy efficiency. Although both organic light-emitting diodes (OLEDs) and microLEDs possess good energy efficiency, the microLEDs, based on group III/V (e.g., GaN) LED technology, offer higher brightness, higher luminous efficacy and longer lifespan than the OLEDs.

Active matrix using thin-film transistors (TFT) may be used in companion with microLEDs to drive a display panel. However, microLED is made by flip chip technology, while TFT is made by complementary metal-oxide-semiconductor (CMOS) process which is more complex than flip chip technology. These two distinct technologies may cause thermal mismatch. A drive current of the microLED is small in gray display, which may be significantly affected by leakage current.

Passive matrix is another driving method performed by a row drive circuit and a column drive circuit, which are disposed on the periphery of a display panel. When the size or the resolution of the display panel increases, output loading and delay of the drive circuits increase accordingly, causing the display panel to malfunction. Therefore, passive matrix is not suitable for large-size microLED display panels.

A need has thus arisen to propose a novel microLED display panel, particularly a large-size or high-resolution display panel, which is capable of maintaining advantages of microLEDs and overcoming disadvantages of driving schemes.

SUMMARY OF THE INVENTION

In view of the foregoing, it is an object of the embodiment of the present invention to provide a microLED display panel capable of effectively reducing loading of drivers, thereby making whole large-size high-resolution microLED display panel feasible. Passive driving scheme is adopted in one embodiment to simplify the process of making display panels, reduce turn-on time of the microLEDs, increase drive current, and effectively minimize effect on gray display due to leakage current.

According to one embodiment, a microLED display panel includes a plurality of microLEDs, a substrate and a plurality of drivers. The substrate is utilized for supporting the microLEDs, and the substrate is divided into a plurality of sub-regions. The drivers are correspondingly disposed on surfaces of the sub-regions respectively. In one embodiment, the microLEDs are driven by a passive driving method. The driver includes a column drive circuit, which transmits column drive signals to first electrodes of the microLEDs on same columns via column conductive wires; and a row drive circuit, which transmits row drive signals to second electrodes of the microLEDs on same rows via row conductive wires. The driver includes a low-dropout (LDO) regulator and a drive circuit, the LDO regulator receiving a system power, according to which a regulated power is generated and provided to the drive circuit.

DETAILED DESCRIPTION OF THE INVENTION

Figure 1A:
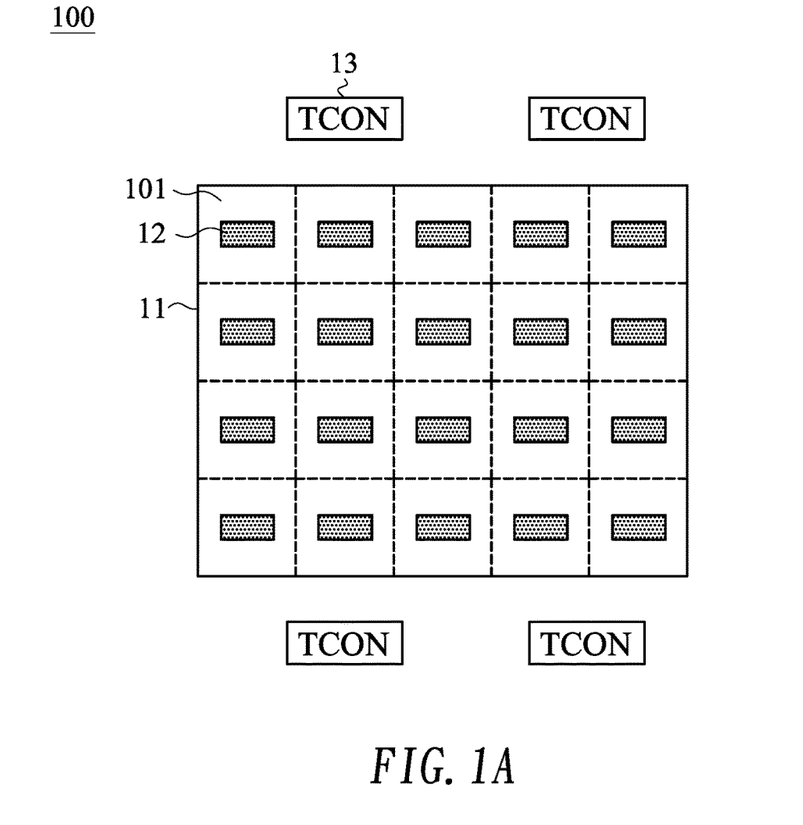
FIG. 1A shows a top view illustrated of a microLED display panel according to one embodiment of the present invention.
Figure 1B:
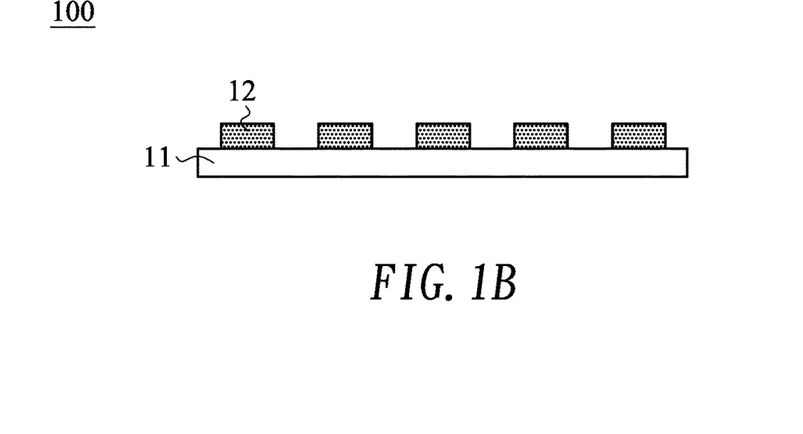
FIG. 1B shows a side view illustrated of the microLED display panel of FIG. 1A.

FIG. 1A shows a top view illustrated of a micro light-emitting diode (microLED) display panel 100 according to one embodiment of the present invention, and FIG. 1B shows a side view illustrated of the microLED display panel 100 of FIG. 1A. The microLED display panel of the embodiment is preferably adaptable to a large-size and high-resolution (e.g., 3840RGB×2160) display panel. In the specification, the size range of the microLED is between 1 and 10 micrometers. However, the size of the microLED may be even smaller due to specific applications or technological advance. In the specification, "large-size" display panel is currently and commonly referred to 10 inches or above display panel. However, "large-size" display panel may be referred to other display size due to specific applications or technological advance. In the specification, "high-resolution" display panel is currently and commonly referred to a display panel with 1080 or above scan lines. However, "high-resolution" display panel may be referred to other amount of scan lines due to specific applications or technological advance.

In the embodiment, the microLED display panel 100 may include a substrate 11 for supporting a plurality of microLEDs (now shown). The substrate 11 may be preferably made of an insulating material (e.g., glass or Acrylic) or other materials suitable for supporting the microLEDs.

According to one aspect of the embodiment, a surface of the substrate 11 is divided into a plurality of sub-regions 101. It is noted that the divided sub-regions 101 are not physically cut through, and the substrate 11 is not made by integrating the sub-regions 101. In other words, the substrate 11 or the microLED display panel 100 is a single or whole entity, or an uncut entity. FIG. 1A shows a simplified example of how the substrate 11 is divided into sub-regions 101. Take a microLED display panel 100 with resolution 3840RGB×2160 as an example, the substrate 11 may be divided into 80×54 sub-regions 101, each having resolution 48RGB×40. Nevertheless, this microLED display panel 100 may be divided into more or less sub-regions 101.

According to another aspect of the embodiment, the microLED display panel 100 may include a plurality of drivers 12, which are correspondingly disposed on (e.g., top) surfaces of the sub-regions 101 respectively. The driver 12 as exemplified in FIG. 1A may, but not necessarily, be disposed in the center of the surface of corresponding sub-region 101. Each sub-region 101 as exemplified in FIG. 1A has one corresponding driver 12. However, in other embodiments, each sub-region 101 may have plural corresponding drivers 12. The driver 12 of the embodiment may be manufactured as an integrated circuit or chip, which is then bonded on the surface of the sub-region 101, for example, by surface-mount technology (SMT) such as chip-on-glass (COG) or flip chip. In one example, the drivers 12 and the microLEDs are disposed on the same surface of the substrate 11.

The microLED display panel 100 of the embodiment may further include a plurality of timing controllers (TCON) 13, which are electrically connected with the substrate 11, for example, via a flexible printed circuit board (FPCB), and are further electrically connected with corresponding drivers 12, for example, via signal traces (not shown) disposed on the substrate 11. In the embodiment, one timing controller 13 may be electrically connected with at least two drivers 12. In other words, the amount of the timing controllers 13 may be less than the amount of the drivers 12. The timing controller 13 may be electrically connected directly with corresponding drivers 12 via signal traces. Alternatively, the timing controller 13 may be electrically connected to one driver 12 via signal traces, and, after signal buffering, then be electrically connected to another driver 12 via signal traces.

Figure 2:
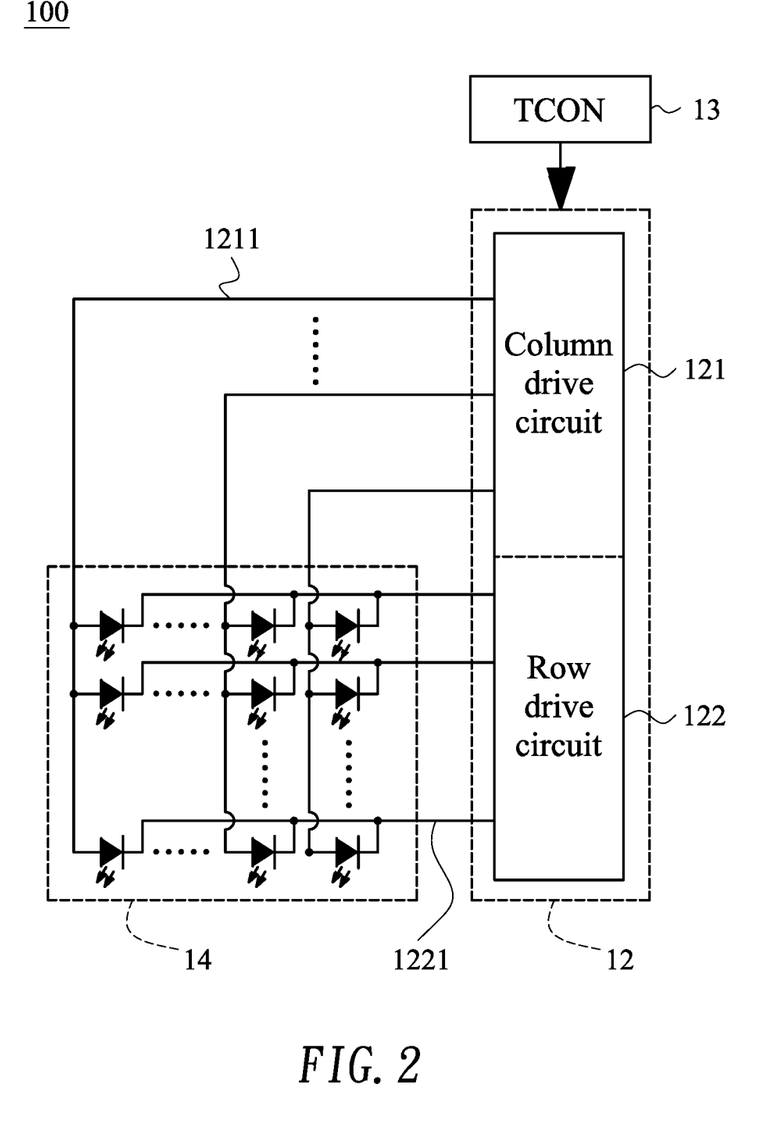
FIG. 2 shows a schematic diagram illustrated of passive driving the microLED display panel.

According to a further aspect of the embodiment, the microLED display panel 100 may adopt passive driving method for driving the microLEDs. FIG. 2 shows a schematic diagram illustrated of passive driving the microLED display panel 100. The timing controller 13 transmits timing control signals and data signals to the driver 12. The driver 12 may include a column drive circuit 121 and a row (or scan) drive circuit 122. The column drive circuit 121 transmits column drive signals to first electrodes (e.g., anodes) of the microLEDs 14 on the same columns via column conductive wires 1211, and the row drive circuit 122 transmits row drive signals to second electrodes (e.g., cathodes) of the microLEDs 14 on the same rows via row conductive wires 1221. In the embodiment, the column drive circuit 121 and the row drive circuit 122 are made in a single integrated circuit.

According to the embodiment discussed above, the substrate 11 of the microLED display panel 100 is divided into sub-regions 101, each of which has a corresponding driver 12. Therefore, loading of the column drive circuit 121 and the row drive circuit 122 may be effectively reduced, thereby making whole large-size high-resolution microLED display panel feasible. Moreover, the microLED display panel 100 of the embodiment adopts a passive driving method (instead of active driving method using thin-film transistors) for driving the microLEDs 14, thereby simplifying the process of making display panels, reducing turn-on time of the microLEDs 14, increasing drive current, and effectively minimizing effect on gray display due to leakage current.

Figure 3:
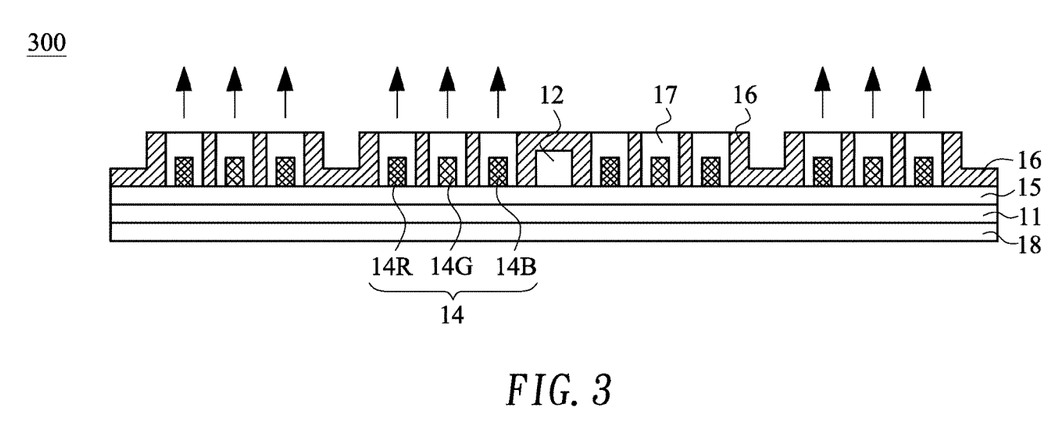
FIG. 3 shows a cross-sectional view illustrated of a frontside illuminating microLED display panel according to a first specific embodiment of the present invention.

FIG. 3 shows a cross-sectional view illustrated of a frontside illuminating microLED display panel 300 according to a first specific embodiment of the present invention. In the embodiment, the microLEDs 14 and the driver 12 are disposed above a top surface of the substrate 11. Light generated by the microLEDs 14 primarily emits upward (i.e., frontside illuminating) from the top surface of the substrate 11 as indicated by arrows.

As exemplified in FIG. 3, each pixel may include a red microLED 14R, a green microLED 14G and a blue microLED 14B. A trace layer 15 is disposed between a (e.g., top) surface of the substrate 11 and the microLEDs 14 and the driver 12. The trace layer 15 is configured to electrically connect the driver 12, the microLEDs 14 and the timing controller 13. A light blocking layer 16 is disposed between adjacent pixels and above the trace layer 15. The light blocking layer 16 of the embodiment may be made of black matrix (BM) or other materials suitable for blocking light. In one embodiment, the light blocking layer 16 may be optionally disposed among the red microLED 14R, the green microLED 14G and the blue microLED 14B of the same pixel.

A light guide layer 17 may be disposed above the red microLED 14R, the green microLED 14G and the blue microLED 14B. The frontside illuminating microLED display panel 300 of the embodiment may further include a cover plate 18 disposed on a bottom surface of the substrate 11. The cover plate 18 of the embodiment may be made of an opaque material.

Figure 4:
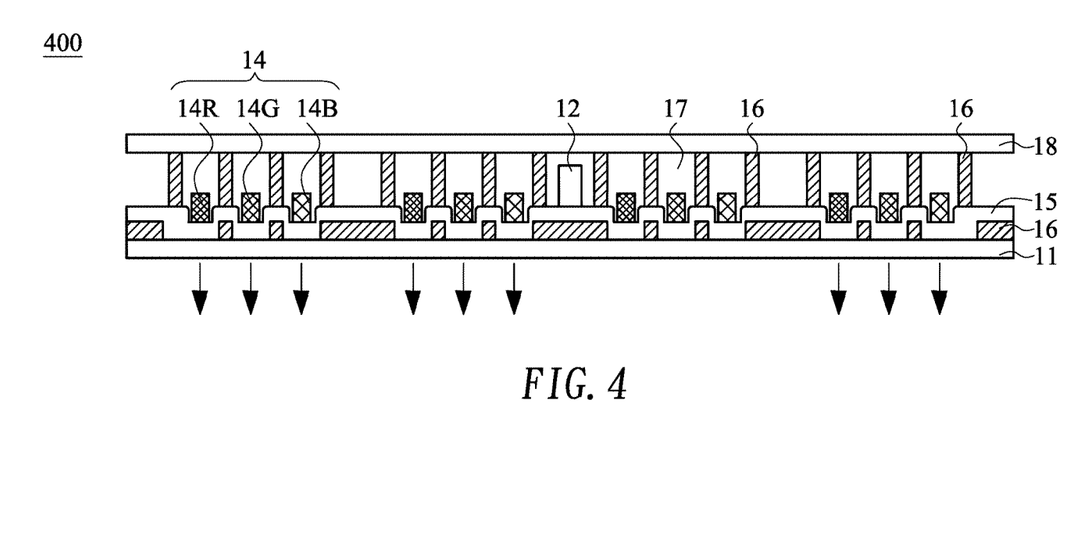
FIG. 4 shows a cross-sectional view illustrated of a backside illuminating microLED display panel according to a second specific embodiment of the present invention.

FIG. 4 shows a cross-sectional view illustrated of a backside illuminating microLED display panel 400 according to a second specific embodiment of the present invention. In the embodiment, the microLEDs 14 and the driver 12 are disposed above a top surface of the substrate 11. Light generated by the microLEDs 14 primarily emits downward (i.e., backside illuminating) from the bottom surface of the substrate 11 as indicated by arrows.

As exemplified in FIG. 4, each pixel may include a red microLED 14R, a green microLED 14G and a blue microLED 14B. A light blocking layer 16 is disposed between adjacent pixels and above a (e.g., top) surface of the substrate 11. The light blocking layer 16 of the embodiment may be made of black matrix (BM) or other materials suitable for blocking light. A trace layer 15 is disposed above the light blocking layer 16 for electrically connecting the driver 12, the microLEDs 14 and the timing controller 13. In one embodiment, the light blocking layer 16 may be optionally disposed among the red microLED 14R, the green microLED 14G and the blue microLED 14B of the same pixel.

A light guide layer 17 may be disposed above the red microLED 14R, the green microLED 14G and the blue microLED 14B. The backside illuminating microLED display panel 400 of the embodiment may further include a cover plate 18 disposed above the driver 12, the trace layer 15, the light blocking layer 16 and the light guide layer 17. The cover plate 18 of the embodiment may be made of an opaque material.

Figure 5:
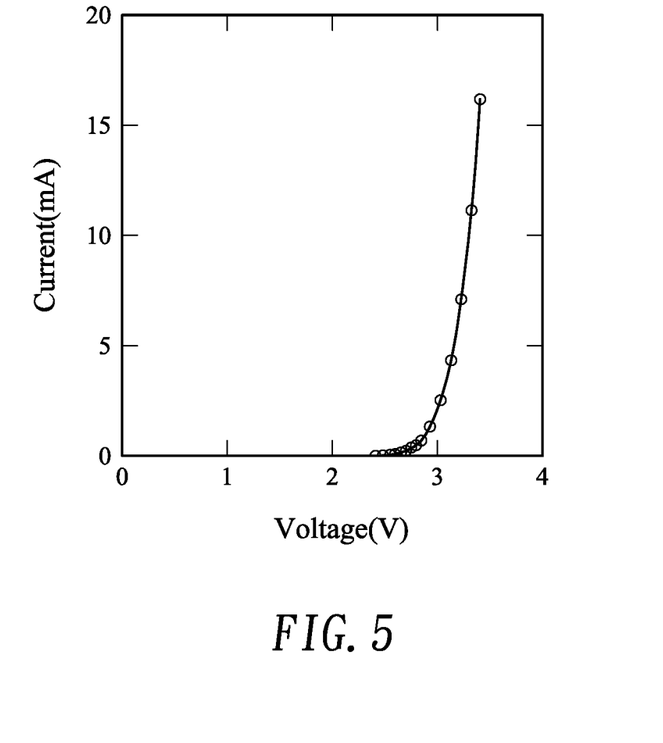
FIG. 5 shows an exemplary current-voltage curve of a microLED.

FIG. 5 shows an exemplary current-voltage curve of a microLED 14. When an operating voltage is greater than a turn-on voltage Vf (e.g., 3 volts), a current greater than a predetermined value may be obtained to normally operate and turn on the micro-LED 14. For the microLED display panel 100 shown in FIG. 1A, a system power for the drivers 12 is VDDA. However, a voltage drop $\Delta V$ exists in the center of the microLED display panel 100 due to impedance in the conductive wire for transferring the power. Accordingly, the drivers 12 disposed in the center of the microLED display panel 100 in fact receive power of VDDA-$\Delta V$, although the drivers 12 disposed on the periphery of the microLED display panel 100 receive power of VDDA. For example, assume the voltage drop ΔV is 1 volt and the turn-on voltage Vf is 3 volts. The condition under which the drivers 12 may be normally operated is VDDA-1>3, that is, VDDA>4 (e.g., VDDA of 5 volts is required). In this situation, the drivers 12 may be made by low-voltage metal-oxide-semiconductor (MOS) process.

Nevertheless, as the amount of microLEDs 14 increases, consumed current then increases and a voltage drop ΔV significantly increases accordingly (e.g., increases to 4 volts). The condition under which the drivers 12 may be normally operated is VDDA-4>3, that is, VDDA>7 (e.g., VDDA of 8 volts is required). In this situation, the drivers 12 should be made by high-voltage metal-oxide-semiconductor (MOS) process, which results in larger circuit area that is unfavorable for making large-size high-resolution (e.g., 3840RGB×2160) display panel. For overcoming the problems, an architecture of a novel driver 12 is proposed.

Figure 6:
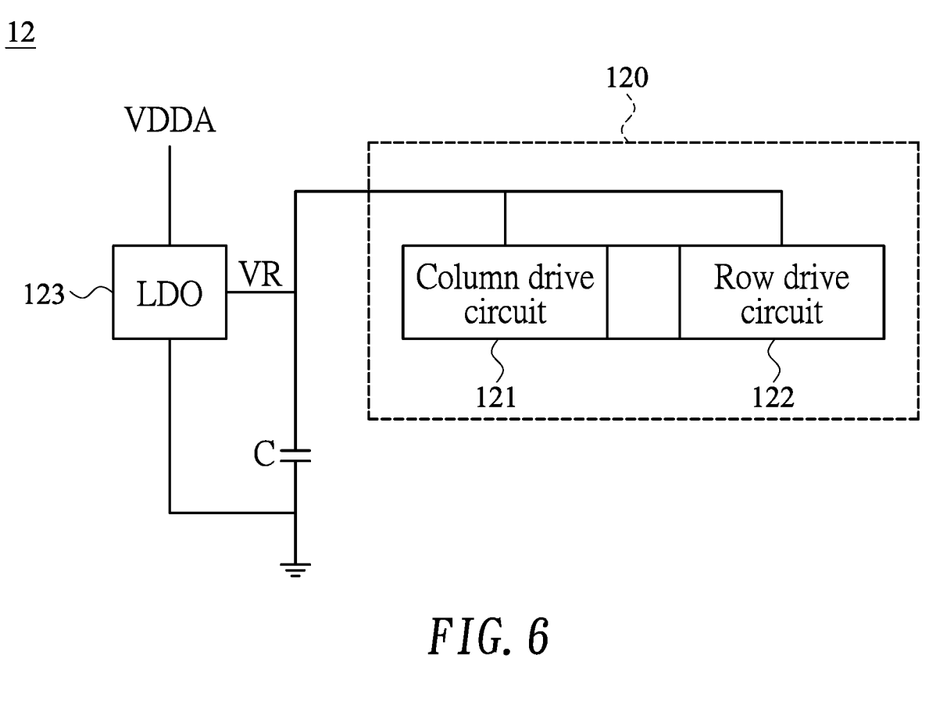
FIG. 6 shows a system block diagram illustrated of a driver according to one embodiment of the present invention.

FIG. 6 shows a system block diagram illustrated of a driver 12 according to one embodiment of the present invention. In the embodiment, the driver 12 may include a low-dropout (LDO) regulator 123 and a drive circuit 120. The LDO regulator 123 receives a system power VDDA, according to which a regulated power VR (e.g., 5 volts) is generated and provided as a power for the drive circuit 120. The LDO regulator 123 of the embodiment may be implemented according to circuit design of conventional LDO regulators, and details of which are thus omitted for brevity. The drive circuit 120 of the embodiment may include a column drive circuit 121 and a row drive circuit 122. The LDO regulator 123 is one of direct-current (DC) linear regulators, which are configured to generate a regulated power VR substantially equal to the system power VDDA. Compared to a switching regulator, the LDO regulator 123 occupies less circuit area with simpler circuit design and without switching noise. In the embodiment, a smoothing capacitor C may be interposed between the regulated power VR and earth, thereby filtering out high-frequency noise. The smoothing capacitor C may be formed with a metal layer process (instead of extra process) commonly used in display panel manufacturing.

According to the driver 12 of the embodiment as discussed above, only the LDO regulator 123 should be made by high-voltage (e.g., greater than 8 volts) MOS process, while the drive circuit 120 may be made by low-voltage (e.g., less than 8 volts) MOS process. On the contrary, for a driver without LOD regulator 123, entire driver 12 should be made by high-voltage MOS process. As a result, the driver 12 of the embodiment may significant reduce circuit area and facilitate making large-size or high-resolution display panels.

Although specific embodiments have been illustrated and described, it will be appreciated by those skilled in the art that various modifications may be made without departing from the scope of the present invention, which is intended to be limited solely by the appended claims.

What is claimed is:

1. A micro light-emitting diode (microLED) display panel, comprising:
    a plurality of microLEDs;
    a substrate for supporting the microLEDs, the substrate being divided into a plurality of sub-regions;
    a plurality of drivers being correspondingly disposed on surfaces of the sub-regions respectively;
    a cover plate disposed on a bottom surface of the substrate such that light generated by the microLEDs primarily emits upward from a top surface of the substrate;
    a trace layer disposed on the top surface of the substrate; and
    a light blocking layer disposed above the trace layer;
    where the microLEDs and the drivers are disposed on a top surface of the trace layer.

2. The microLED display panel of claim 1, wherein the substrate comprises an insulating material.

3. The microLED display panel of claim 2, wherein the substrate comprises glass.

4. The microLED display panel of claim 1, wherein each said driver is disposed in a center of the surface of the corresponding sub-region.

5. The microLED display panel of claim 1, wherein the drivers are bonded on the surfaces of the sub-regions by chip-on-glass (COG) technology.

6. The microLED display panel of claim 1, wherein the drivers and the microLEDs are disposed on a same surface of the substrate.

7. The microLED display panel of claim 1, further comprising a plurality of timing controllers, which are electrically connected with the substrate, which is then electrically connected with the corresponding drivers.

8. The microLED display panel of claim 7, wherein each said timing controller is electrically connected with at least two said drivers.

9. The microLED display panel of claim 1, wherein the microLEDs are driven by a passive driving method.

10. The microLED display panel of claim 9, wherein the driver comprises:
    a column drive circuit, which transmits column drive signals to first electrodes of the microLEDs on same columns via column conductive wires; and
    a row drive circuit, which transmits row drive signals to second electrodes of the microLEDs on same rows via row conductive wires.

11. The microLED display panel of claim 1, further comprising a light guide layer disposed above the microLEDs.

12. The microLED display panel of claim 1, wherein the light blocking layer is disposed between adjacent pixels composed of the microLEDs.

13. The microLED display panel of claim 1, wherein the light blocking layer is disposed among a red microLED, a green microLED and a blue microLED of a pixel.

14. A micro light-emitting diode (microLED) display panel, comprising:
    a plurality of microLEDs;
    a substrate for supporting the microLEDs, the substrate being divided into a plurality of sub-regions;
    a plurality of drivers being correspondingly disposed on surfaces of the sub-regions respectively, the microLEDs and the drivers being disposed on a top surface of the substrate; and
    a cover plate disposed above the microLEDs and the drivers such that light generated by the microLEDs primarily emits downward from the top surface of the substrate.

15. The microLED display panel of claim 14, further comprising:
    a light blocking layer disposed on the top surface of the substrate; and
    a trace layer disposed above the light blocking layer.

16. The microLED display panel of claim 15, wherein the light blocking layer is further disposed between adjacent pixels composed of the microLEDs.

17. The microLED display panel of claim 15, wherein the light blocking layer is disposed among a red microLED, a green microLED and a blue microLED of a pixel.

* * * * *